United States Patent [19]

Dorler et al.

[11] 3,924,264

[45] Dec. 2, 1975

[54] SCHOTTKY BARRIER DEVICE AND CIRCUIT APPLICATION

[75] Inventors: Jack A. Dorler, Wappingers Falls; John L. Forneris, Peekskill; Donald J. Swietek, La Grange, all of N.Y.

[73] Assignee: International Business Machines Corporation, Armonk, N.Y.

[22] Filed: July 15, 1974

[21] Appl. No.: 488,388

Related U.S. Application Data

[63] Continuation of Ser. No. 361,100, May 17, 1973, abandoned, which is a continuation of Ser. No. 209,958, Dec. 20, 1971, abandoned.

[52] U.S. Cl. .................................... 357/15; 357/67
[51] Int. Cl.² .................... H01L 29/48; H01L 23/48
[58] Field of Search ............................... 357/15, 67

[56] References Cited

UNITED STATES PATENTS

| | | | |
|---|---|---|---|
| 3,725,309 | 4/1973 | Ames et al. | 317/67 |

*Primary Examiner*—Stanley D. Miller, Jr.
*Assistant Examiner*—E. Wojciechowicz
*Attorney, Agent, or Firm*—Wesley DeBruin

[57] ABSTRACT

A Schottky barrier diode suitable for implementation in monolithic form for multi-functioned circuit applications comprising a semiconductor substrate and Schottky barrier diodes, each comprising a more than one metal fixed system contacting the semiconductor substrate for forming Schottky barrier junctions.

1 Claim, 7 Drawing Figures

SCHOTTKY BARRIER DEVICE AND CIRCUIT APPLICATION

Related Application

This application is a continuation of U.S. patent application Ser. No. 361,100, filed May 17, 1973. Ser. No. 361,100 is a continuation of U.S. patent application Ser. No. 209,958, filed Dec. 20, 1971 both abandoned.

Background of the Invention

1. Field of the Invention

This invention relates to integrated circuit devices and more particularly to Schottky barrier diodes.

2. Related Applications

U.S. patent application Ser. No. 209,976, filed Dec. 20, 1971, by Jack A. Dorler et al entitled "Schottky Barrier Diode Read-Only Memory" granted Dec. 18, 1973 as U.S. Pat. No. 3,780,320 and of common assignee herewith.

3. Description of the Prior Art

The theory of Schottky barrier diodes is a well known phenomenon dating back many years. However, until recently, the use of Schottky barrier diodes in monolithic form has been limited due to considerations of yield, performance and compatibility with existing monolithic processes which greatly contribute to the overall cost of fabricating the Schottky barrier diodes.

As is well known in the prior art, the primary electrical characteristics of a Schottky barrier diode are determined by the difference in work function between the metal and the semi-conductor substrate upon which it is formed. Once this basic characteristic curve is determined, the family of characteristic curves is then modifiable in accordance with the particular geometry of the Schottky barrier diode. Thus, when attempting to implement Schottky barrier diodes in monolithic form for various circuit applications, it is often necessary to use different type metals to form different Schottky barrier diodes depending upon their particular circuit application, which again is limited by the particular work function of the single metal employed and the semiconductor substrate. This requirement poses an extreme hardship in high volume integrated circuit manufacturing lines.

Also, the incorporation of Schottky barrier diodes into monolithic circuits has been impeded due to the fact that many of the metals necessary to form a particular Schottky barrier diode having the desired electrical charcteristics are of a particular metal incompatible with integrated circuit interconnection metallurgical systems of the user. Therefore, the processes were involved and costly.

Summary of the Invention

Therefore, it is an object of the present invention to provide a Schottky barrier diode which is extremely simple to fabricate in monolithic form and still extremely reliable in both the forward and reverse biased conditions and which also can be manufactured with attendant high yields.

Another object of the present invention is to provide a Schottky barrier diode which is compatible with known metallurgical interconnection technologies.

A further object of the present invention is to provide a Schottky barrier diode comprised of a fixed metallurgical system which exhibits a family of characteristic curves suitable for application in multi-functioned integrated circuits, both memory and logic.

In accordance with the above-mentioned objects, the present invention provides a Schottky barrier diode suitable for implementation in monolithic form in multi-functional integrated circuits, memory and logic, comprising a semiconductor substrate and a more than one metal system contacting the semi-conductor substrate for forming Schottky barrier diode junctions.

The foregoing and other objects, features and advantages of the invention will be apparent from the following more particular description of the preferred embodiments of the invention as illustrated in the accompanying drawings.

Brief Description of the Preferred Embodiments

Figure 1:
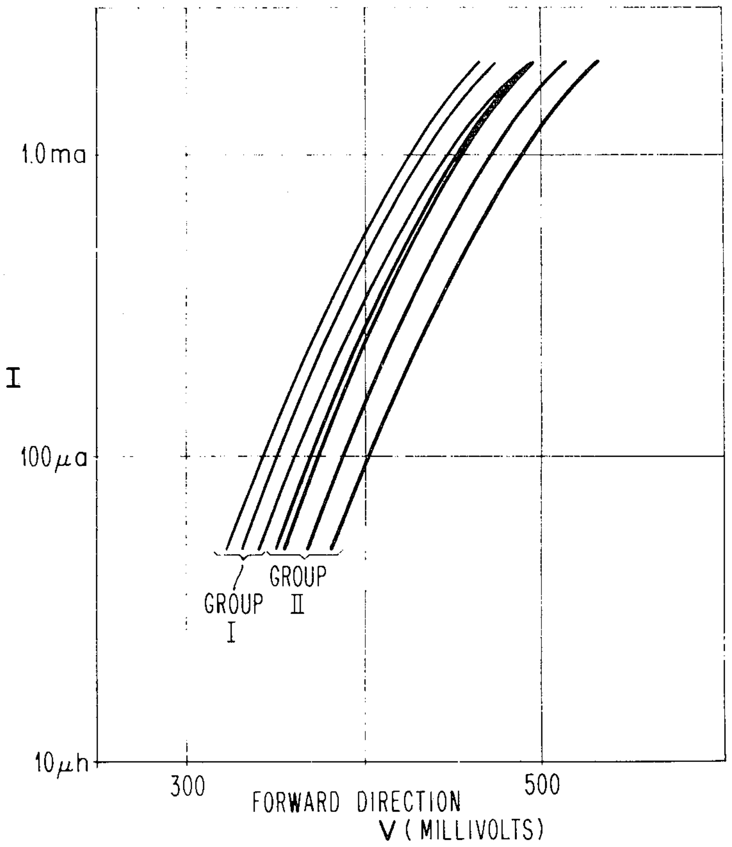
FIG. 1 illustrates a comparison and the tailoring of the basic characteristic curves for the Schottky barrier diode of the present invention, i.e., more than one metal system against a single metal system.

The characteristic curves in FIG. 1 illustrate a comparison between a Schottky barrier diode formed of a single metal, aluminum, and Schottky barrier diodes formed with a more than one metal Schottky barrier junction depicted as Groups I and II. The variations within each of the Groups I and II occur as a result of process variations intentionally employed in a formation of the Schottky diodes. However, the V-I characteristic curves in the forward direction clearly illustrate that the addition of copper to the pure aluminum system, taking the best case or the third curve in Group I, as compared to the last curve in Group II, produces an increased forward voltage drop of approximately 40 millivolts. The preferred embodiment of the present invention employs a copper aluminum alloy because this metallurgical system is ideally compatible with an aluminum copper metallurgical interconnection system implemented as part of the present invention, and thus greatly simplifies the overall fabrication process of monolithic integrated circuits encompassing other devices such as transistors, resistors, and capacitors, etc. However, it is to be realized that other more than one metal or alloy systems are equally suitable depending upon the needs of the user, taking into consideration the desired electrical characteristics of the integrated circuits as well as the metallurgical system of the overall integrated circuit process.

Implementation of the Schottky barrier diode, of the present invention into a multi-functional integrated circuit scheme results in significant advantages over known prior art techniques which employ either collectively or individually, diffused-type diodes, transistors, or Schottky barrier diodes having varied metallurgical semiconductor junctions.

Figure 2:
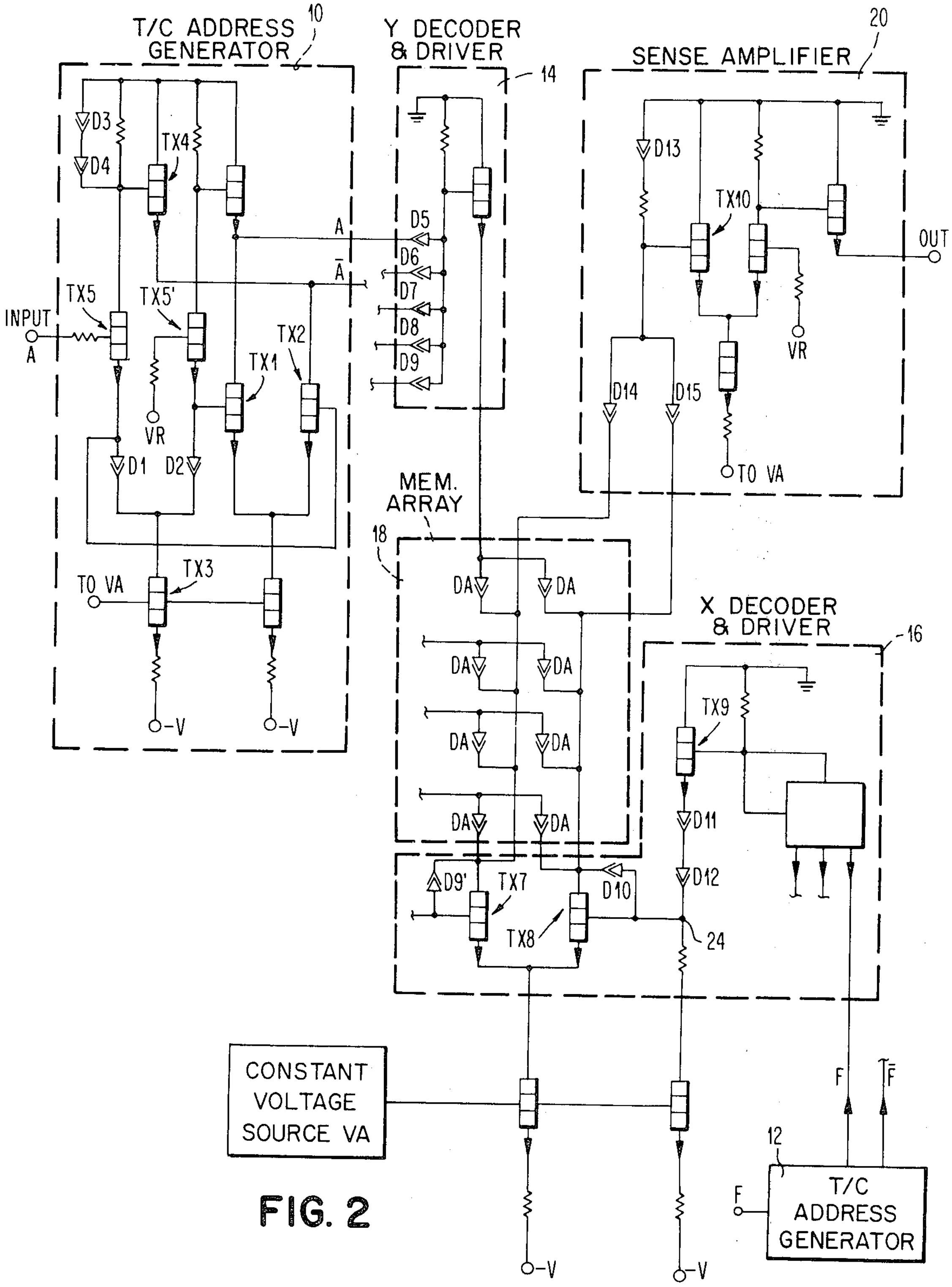
FIG. 2 is a schematic representation of a multi-functional integrated circuit including a read-only memory and the attendant decoding and sensing circuitry which can be entirely implemented with a Schottky barrier diode having a fixed metallurgical system compatible with the electrical requirements of the different integrated circuits.

In FIG. 2, a memory array including addressing and sensing circuits is represented for a 1024-bit read-only memory. Only one of the five necessary address true-complement (T/C) generators for the Y direction is depicted at 10. In other words, for a 1024-bit read-only memory, four other true-complement address generators are necessary in order to accommodate four separate decoding signals B, C, D and E (none shown). The output from the true-complement address generator comprises a true output signal depicted at A and a complementary output signal depicted at $\bar{A}$. Similarly, an X address true-complement address generator is shown at 12 and provides a true output signal F and a complementary output signal F in response to an address input signal $\bar{F}$. Only one of three true-complement address generators is shown for what would actually be required in a 1024-bit memory.

In the Y direction, one of 32 decode driver circuits is illustrated at 14, and in the X direction, one of eight X decoder and driver circuits is designated 16. Finally, a portion of the 1024-bit read-only diode array and output sense amplifier elements 18 and 20, respectively, complete the circuitry.

The particular operation of the X and Y true-complement address generators, the X and Y decoder driver circuits, the memory array and the output sense amplifier per se do not constitute the essence of the invention, but are illustrated in order to exhibit the ability to implement a plurality of different and unique integrated circuits, including logic and memory circuits, with Schottky barrier diode having a fixed metallurgical system and varying only in size and geometry, depending upon its application in the various integrated circuits.

The Y true-complement address generator 10 and the X true-complement address generator 12 are identical circuits, but only the details of the circuit 10 are shown for purposes of simplicity. Both the circuits function to provide a true and a complement output A, $\bar{A}$ in response to an input signal A. Other than the use of Schottky barrier diodes in the circuit, this circuit 10 basically comprises current switch emitt-follower logic, and its general operation is well known in the art.

A pair of Schottky diodes D1 and D2 function to isolate the emitters of transistors TX5 and TX5′ from each other, and thus allow logic functions to be performed at both the emitter and collector of each of these transistors TX5 and TX5′. The advantages of employing Schottky barrier diodes D1 and D2, rather than diffused diodes, results from the fact that when implemented in monolithic form, the diodes D1 and D2 are integratable into the collector of transistor TX3 and thus allow higher densities.

In order to clamp a transistor TX4 in the true-complement address generator 10, a pair of Schottky barrier diodes D3 and D4 are connected between its base and collector junctions. The pair of Schottky barrier diodes, as implemented in accordance with the present invention, provide the necessary larger critical voltage drop than that which is obtainable with a single diffused diode. That is, the pair of diodes D3 and D4 provide a critical voltage drop of approximately 1.0 volts while a single diffused diode could only provide a voltage drop of approximately 0.8 volts which would be insufficient to clamp transistor TX4 and thus maintain an input transistor TX5 out of saturation. The use of a pair of Schottky barrier diodes implemented in accordance with the present invention naturally offers a significant advantage over the use of a transistor for clamping purposes in that the Schottky barrier diodes offer significant yield advantages over transistors.

The Y decoder and driver circuit 14 comprises a plurality of Schottky barrier diodes D5 through D9. These diodes in combination, provide an "AND" function. Again, advantages of increased yield, speed, reduced area are realized by implementing this logic function with Schottky barrier diodes as opposed to conventional diffused diodes.

A portion of the 1024-bit Schottky barrier diode read-only memory 18 comprises eight Schottky barrier diodes depicted at DA. The characteristics of these particular Schottky barrier diodes fall in the range between the curves labeled 21 and 22 of the curves designated 21, 22 and 23 of FIG. 7, depending upon their position in the array, since resistance varies as a function of the diode array position and thus influences its V-I characteristics. Again, the advantages over diffused diodes are reduced area, increased speed, and increased yield. The same benefits accrue by the use of Schottky barrier diodes instead of conventional diffused transistors.

Now referring to the X decoder and driver circuit 16, a pair of diodes D9′ and D10 provide a clamp function for each of their associated transistors TX7 and TX8. Again, the advantages of using Schottky barrier diodes in this logic function reside in its monolithic compatibility with the overall process of fabricating a fixed metallurgical system identical throughout the plurality of integrated circuits, while still being able to meet the necessary electrical requirements. Also, a pair of serially connected Schottky barrier diodes D11 and D12 provide a critical voltage translation between the emitter of transistor TX9 and node 24. In this circuit application, a translation drop of 1.0 volts is necessary and with present-day technology, the only equivalent would be the use of a transistor and resistor, which again would present the disadvantage previously mentioned.

Now referring to the output sense amplifier 20, a Schottky barrier diode D13 functions to provide a critical voltage drop between the collector and base of transisor TX10. Increased yield results from the use of a Schottky barrier diode in this application as opposed to a diffused diode.

Also located in the circuit 20 are a pair of Schottky barrier diodes D14 and D15 which function to isolate the diodes in the array from each other and also function to translate voltage from their cathode to the base of the input sense amplifier TX10. Again, reduced area, increase speed, and increased yield advantages result from the use of Schottky barrier diodes in this position as opposed to other known device substitutes.

As will be described in more detail with respect to FIG. 3, it can be seen that a more than one metal Schottky barrier diode fabricated from an identical process, using identical materials, is ideally suitable for implementation in different functional integrated circuits, memory and logic.

Figure 3:
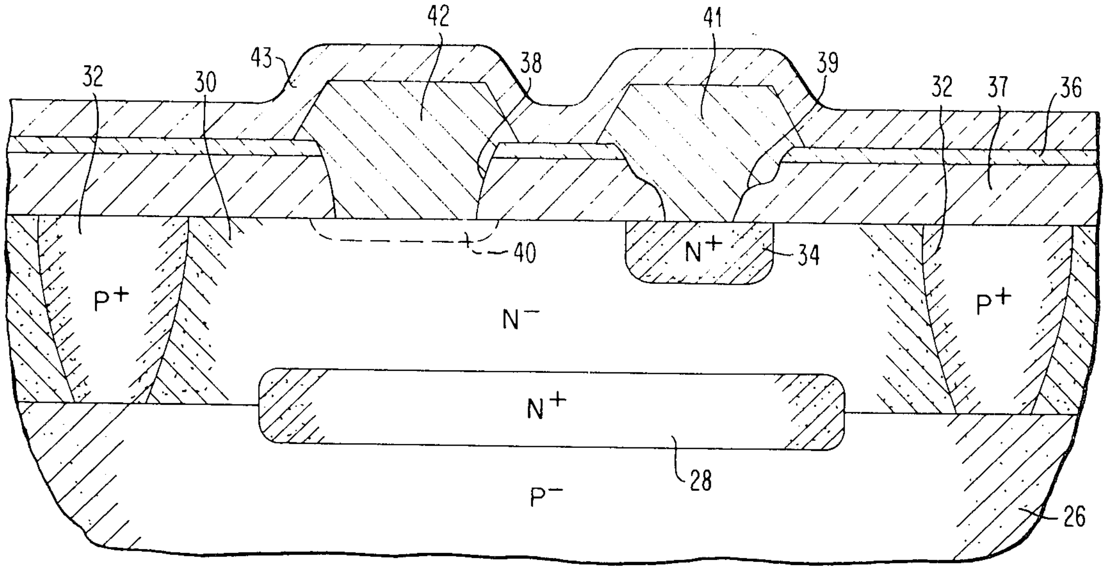
FIG. 3 shows a Schottky barrier diode structure fabricated according to one preferred embodiment of the present invention.

Now referring to FIG. 3 for a description of the Schottky barrier device and the process for fabricating the same, a starting P− semiconductor substrate 26 is initially selected. Next, an N+ region 28 is diffused into the starting substrate 26. Then, an N− epitaxial layer 30 is deposited over the substrate 26 at which time the N+ region 28 outdiffuses therein to form the region 28 as schematically depicted. Next, an isolation diffusion forms P+ isolation region 32 for isolating the Schottky barrier diode. Then, an N+ impurity is diffused into the epitaxial layer 30 to form an N+ region 34 which eventually constitutes the cathode of the Schottky barrier diode. After forming the N+ region 34, a thin silicon dioxide layer 36 is deposited over the oxide layer 37. The oxide layer 37 is formed thermally during the previously described processing steps. Next, using conventional photolithographic and etching techniques, a pair of contact openings 38 and 39 are formed through the oxide layers 37 and 36.

Three process steps are then required to form the regions designated 40, 41 and 42. The region 40 constitutes the anode of the Schottky barrier diode and comprises an aluminum, copper, and silicon alloy. The regions 41 and 42 provide contacts to the cathode and anode of the Schottky barrier diode, respectively.

In order to form these regions, a blanket aluminum copper evaporation is performed over the entire surface. In one specific embodiment, a 95 percent aluminum metal by weight, and a 5 percent copper metal by weight, metallurgical system is co-deposited at a temperature of 200°C to a height of 1.2 microns over the entire upper surface. Next, the entire device is sintered at 400°C for 75 minutes in a nitrogen or relatively inner gaseous ambient. Then a suitable etchant is employed to etch away the aluminum and copper material in order to define the regions 42 and 41. These regions thus function as part of the diode and also as conventional interconnection metallurgy, defined by the etching operation, so as to interconnect the Schottky diodes with other active and passive devices on the substrate.

The temperature of 200°C is selected for the evaporation of the aluminum-copper metallurgical system in this particular embodiment in order to provide the desired metallurgical grain size, adhesion characteristics, and migration qualities.

Another suitable embodiment employs 92 percent by weight aluminum, 5 percent by weight copper, and 3 percent by weight of silicon for the evaporation step. In this instance, the silicon is added to the metallurgical system in order to aid in preventing the aluminum from going into the semiconductor material, and thus, in some instances, avoid degradation of device performance. A sputtered quart layer 43 is finally deposited over the device as a final passivation step.

Figures 4, 5, 6:
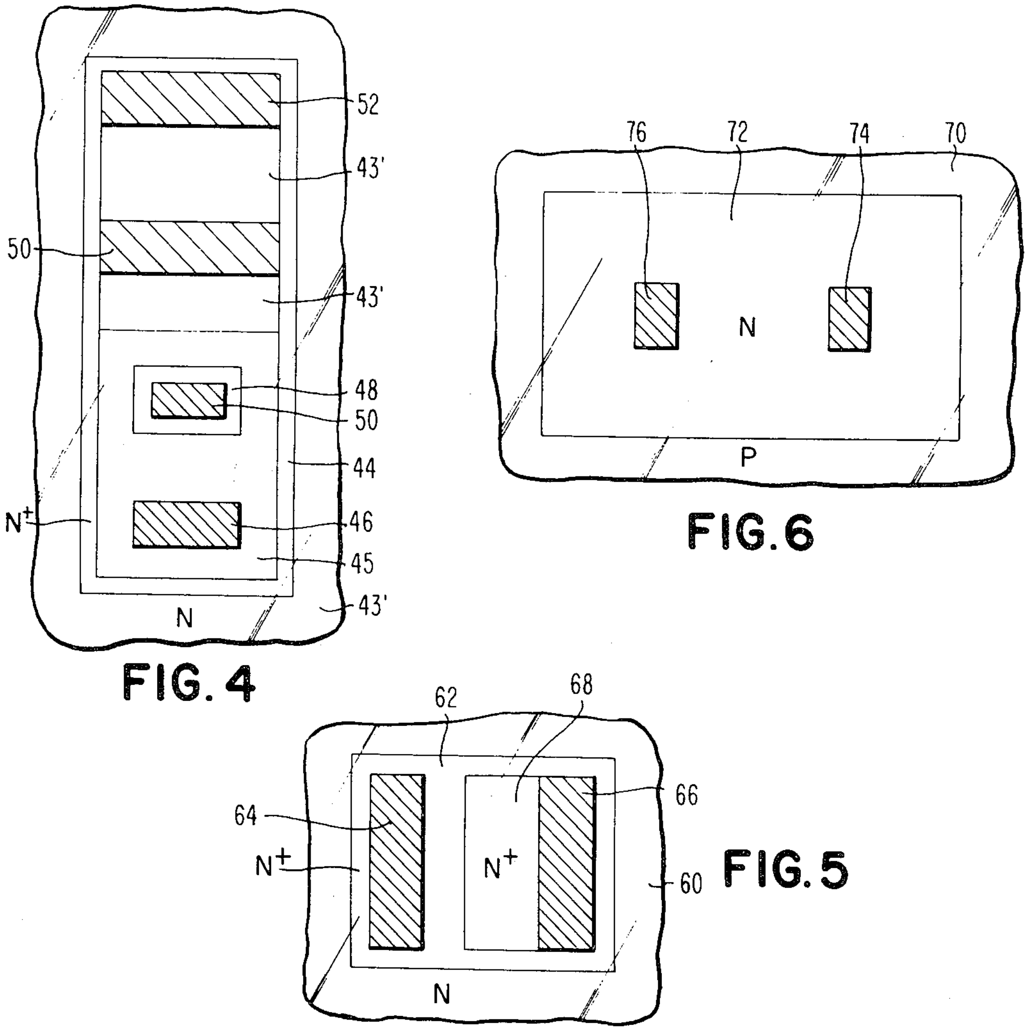
FIGS. 4, 5 and 6 illustrate specific monolithic implementation of a Schottky barrier diode and various functional circuits of FIG. 1.

FIG. 4 illustrates the monolithic implementation of the Schottky barrier diode D4 into the collector of transistor TX5 (FIG. 2). Within the N epitaxial layer 43' is located N+ subcollector region 44. The base region and base contact for transistor TX5 comprises region 45 and contact 46.

An emitter region 48 and an emitter contact 50 complete the structure of transistor TX5. Integratable therewith, the Schottky barrier diode D4 comprises an anode terminal 50 in contact with the aluminum, copper and silicon alloy forming the Schottky barrier diode junction (not shown), and a cathode contact 52 to an N+ region (not shown).

In FIG. 5, the monolithic implementation of a Schottky barrier diode corresponding to that shown, for example, in FIG. 2 as diode D12 is illustrated. The structure comprises an N epitaxial region 60 in which is formed an N+ buried layer 62. An anode contact 64 to the aluminum, copper and silicon alloy Schottky barrier junction (not shown) and a cathode contact 66 to an N+ diffused region 68 constitute the complete Schottky barrier device. In other words, the barrier height of the rectifying Schottky barrier diode is essentially determined by the difference in work function between the more than one metal system and the semiconductor material.

In FIG. 6 the Schottky barrier diode comprises a P+ isolation region 70, an N-type epitaxial layer 72, an anode contact 74, and a cathode contact 76, and corresponds to the implementation of a diode such as D3, depicted in FIG. 2.

Thus, the implementation of a monolithic integrated circuit employing Schottky barrier diodes formed with a more than one metallurgical system results in a high yield and high performance devices which are compatible with existing interconnection metallurgies and thus provides great economical savings. Moreover, the Schottky barrier diodes fabricated in accordance with the present invention exhibit excellent performance under both forward and reverse bias conditions for numerous circuit applications without having to resort to other metallurgical systems to form the Schottky barrier diode necessary for particular circuit applications.

Figure 7:
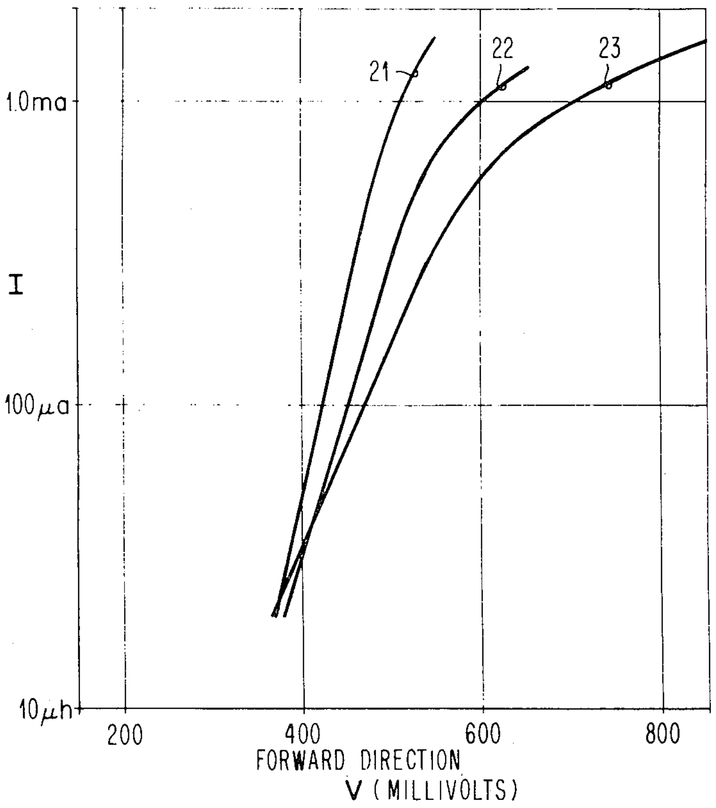
FIG. 7 illustrates accompanying characteristic curves for the Schottky barrier diode of the present invention for different circuit application.

Specifically, FIG. 7 further illustrates this tailoring capability. The curve designated 21 defines the V-I characteristics for the Schottky diodes such as those designated (FIG. 2) D1, D2, D4 and D9-D15, and curve 23 defines the V-I characteristics for diodes corresponding to that such as D3 (FIG. 2).

Although the invention has been particularly shown and described with reference to the preferred embodiments thereof, it will be understood by those skilled in the art that the foregoing and other changes in form and details may be made therein without departing from the spirit and scope of the invention.

What is claimed is:

1. In a high circuit density device fabricated by large scale integration techniques on a planar surface of a silicon semiconductor substrate, said device having a plurality of circuit elements, said circuit elements including transistors, resistors, and Schottky Barrier diodes, said substrate having a substantially planar surface, a thin layer of insulating material on said planar surface of said semiconductor substrate, said thin layer of insulating material having a plurality of discrete windows, each of said windows of said thin insulating layer exposing a portion of said planar surface of said semiconductor substrate, each of said windows providing access to said circuit elements, a first one of said plurality of windows exposing a first small surface area of said planar surface of said semiconductor substrate having N− type conductivity, a second one of said plurality of windows exposing a second small surface area of said planar surface of said semiconductor substrate having N+ type conductivity, said first and said second windows being closely displaced in space on said surface of said semiconductor substrate, wherein the improvement comprises:

interconnection metallurgy means for interconnecting said circuit elements, said interconnection means consisting essentially of an alloy of 95% by weight aluminum and 5% by weight copper, said interconnection means being superimposed on said thin insulating layer and integrally connected through each of said windows to said planar surface of said semiconductor substrate, whereby said first and second small surface areas of said planar surface of said semiconductor substrate respectively comprise the anode and cathode area of a Schottky Barrier diode, and said Schottky Barrier diode is integrally connected to said circuit elements by said interconnections means consisting essentially of said alloy of aluminum and copper.

* * * * *